United States Patent [19]
Taoka

[11] Patent Number: 5,386,389
[45] Date of Patent: Jan. 31, 1995

[54] SEMICONDUCTOR MEMORY DEVICE HAVING A TIME VARIABLE SENSE AMPLIFIER

[75] Inventor: Hideho Taoka, Kasugai, Japan

[73] Assignees: Fujitsu Limited, Kawasaki; Fujitsu VLSI Limited, Kasugai, both of Japan

[21] Appl. No.: 34,129

[22] Filed: Mar. 18, 1993

[30] Foreign Application Priority Data

Mar. 19, 1992 [JP] Japan .................. 4-063989

[51] Int. Cl.$^6$ ............................................. G11C 7/00
[52] U.S. Cl. ................... 365/230.06; 365/205; 365/207; 365/194
[58] Field of Search ............... 365/205, 222, 204, 207, 365/208, 189.01, 190, 194, 196, 210, 230.06

[56] References Cited

U.S. PATENT DOCUMENTS

| | | | |
|---|---|---|---|
| 4,716,551 | 12/1987 | Inagaki | 365/222 |
| 4,811,290 | 3/1989 | Watanabe | 365/205 |
| 5,007,024 | 4/1991 | Tanaka et al. | 365/210 |

FOREIGN PATENT DOCUMENTS 2-310888 12/1990 Japan .
2-310889 12/1990 Japan .

Primary Examiner—Eugene R. LaRoche
Assistant Examiner—Vu Le
Attorney, Agent, or Firm—Nikaido, Marmelstein, Murray & Oram

[57] ABSTRACT

A semiconductor memory is set in a required operation mode according to an external instruction. The memory properly controls the activation timing of a sense amplifier (1) incorporated in the memory. The memory is capable of surely amplifying a voltage difference between bit lines in every operation mode with no delay in access time, to achieve a high-speed operation.

The memory has the sense amplifier (1) for detecting and amplifying a voltage difference between complementary bit lines that transfer data to and from a corresponding memory cell, and a unit (2) for changing the activation timing of the sense amplifier according to an externally instructed operation mode (C).

8 Claims, 9 Drawing Sheets

SEMICONDUCTOR MEMORY DEVICE HAVING A TIME VARIABLE SENSE AMPLIFIER

BACKGROUND OF THE INVENTION

1. Field of the Invention

The present invention relates to a semiconductor memory, and particularly, to a technique of controlling the timing of activation of a sense amplifier of a random access memory (RAM) in a specific operation mode set according to an external instruction.

2. Description of the Related Art

RAMs presently marketed include standard RAMs that provide only a normal read/write function and dual port RAMS that provide, in addition to the normal read/write function, a collective write (a flash write) function and a write transfer function.

Figure 4:
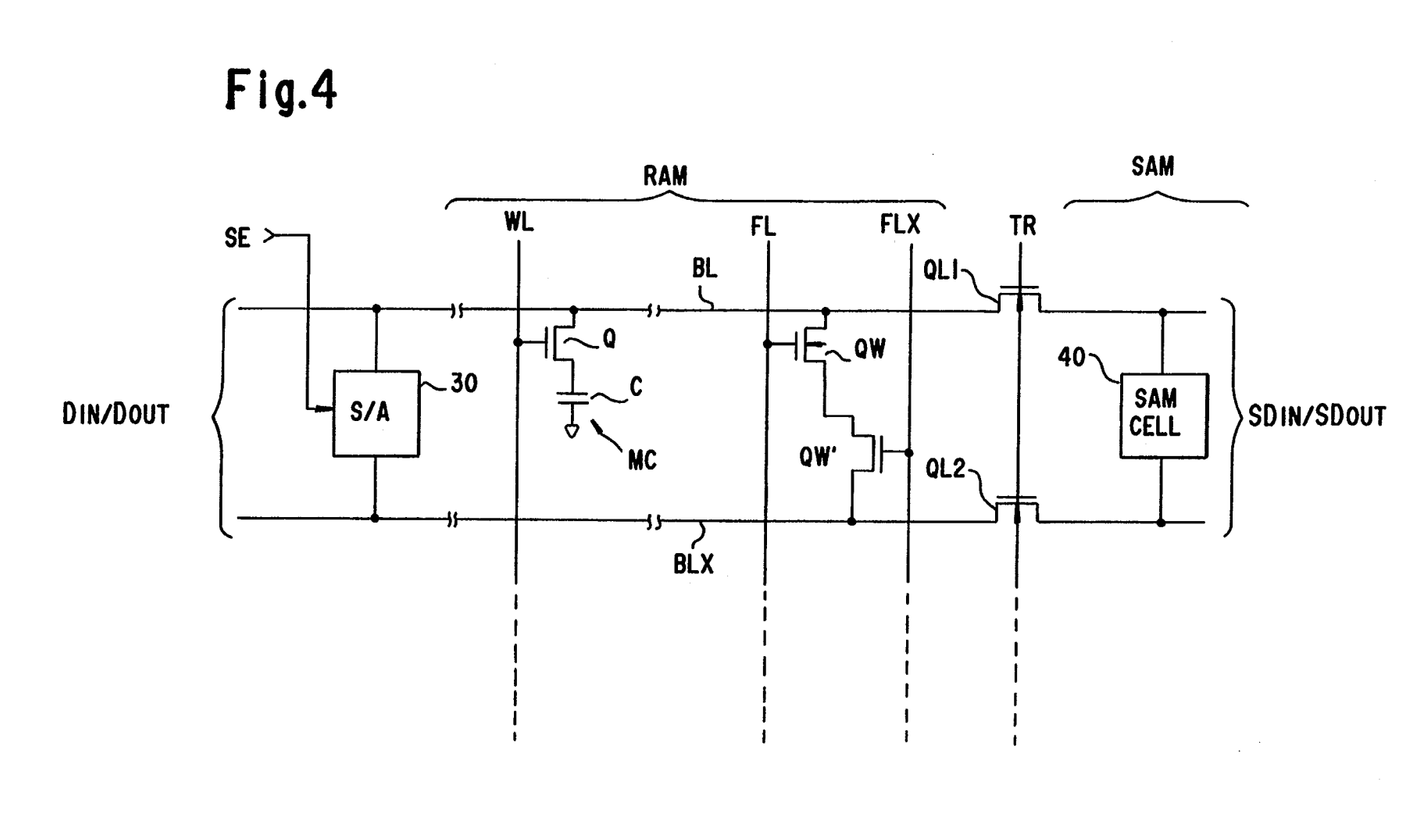
FIG. 4 is a circuit diagram showing an essential part of a dual port RAM according to a prior art.

FIG. 4 shows essential part of the dual port RAM.

The RAM includes word lines WLs (only one is shown), pairs of complementary bit lines BL and BLX (only one pair is shown), a pair of flash write control signal lines FL and FLX, a write transfer control signal line TR, an I/O port DIN/DOUT on the RAM side, and an I/O port SDIN/SDOUT on the serial access memory (SAM) side.

A memory cell MC having a transistor Q and a capacitor C is formed at an intersection between the word line WL and the bit lines BL and BLX. N-channel transistors QW and QW' are formed at intersections between the signal lines FL and FLX and the bit lines BL and BLX. The transistors QWs and QW's are used when collectively writing data of 0 or 1 into the memory cells MCs.

N-channel transistors QL1 and QL2 are formed in the bit lines BL and BLX, respectively, and are connected in series. These transistors are turned ON and OFF in response to the potential of the signal line TR, to control data transfer between the memory cell MC on the RAM side and a cell MS on the SAM side.

A sense amplifier 30 senses and amplifies a voltage difference between the bit lines BL and BLX, in response to a sense amplifier activation signal SE.

Figure 5:
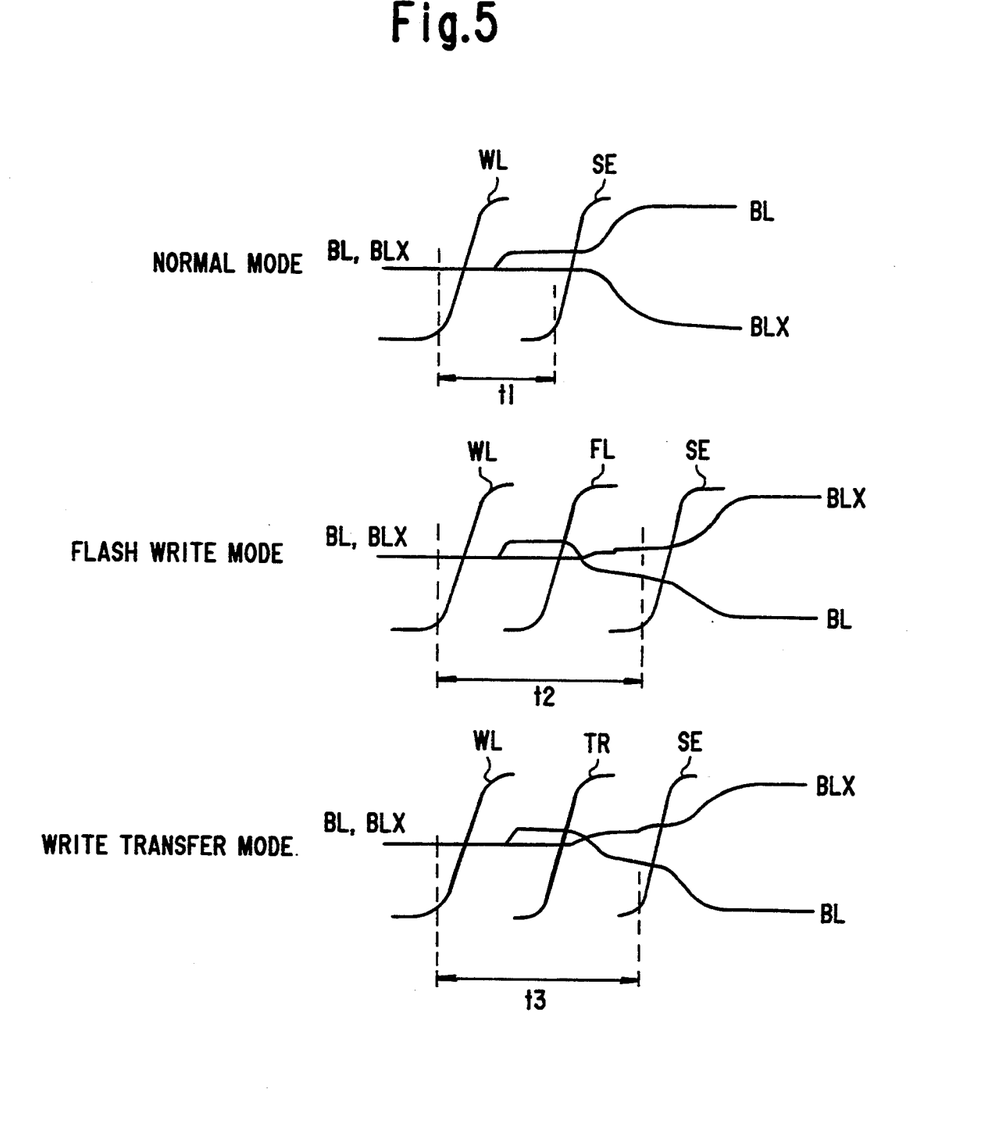
FIG. 5 is a signal timing chart of different operation modes, explaining the problem of the prior art.

Operation modes of the dual port RAM will be explained with reference to a signal timing chart of FIG. 5.

A normal mode (a normal read cycle) will now be explained. The word line WL is set to level HIGH to turn ON the cell transistor Q. The cell capacitor C then provides the bit line BL with cell data, to slightly increase the potential of the bit line BL. This produces a small voltage difference between the bit lines BL and BLX. After a period t1 in which the small voltage difference becomes stable, the sense amplifier activation signal SE is set to HIGH to activate the sense amplifier 30. The sense amplifier 30 then amplifies the small voltage difference to a given level.

A flash write mode will now be explained. Similar to the normal mode, the word line WL is set to HIGH to turn ON the cell transistor Q. The cell capacitor C then provides the bit line BL with cell data, to slightly increase the potential of the bit line BL. To forcibly set every memory cell in the RAM to 0 or 1, the signal line FL is increased to HIGH to turn ON every transistor QW. This results in dropping the potential of the bit line BL lower than the original level, to produce a small voltage difference between the bit lines BL and BLX. The profile of this voltage difference is opposite to that of the voltage difference in the normal mode. After a period t2, the activation signal SE is set to HIGH to activate the sense amplifier 30. The sense amplifier 30 amplifies the small voltage difference to a given level.

A write transfer mode will now be explained. This mode requires a period t3 from when the word line WL is increased to HIGH until a voltage difference between the bit lines BL and BLX becomes stable. In this mode, the voltage difference changes differently from the normal mode.

As explained above, a voltage difference between the bit lines differs from mode to mode. To secure a correct operation in each mode, the timing of activation of the sense amplifier 30 must be determined according to the mode that requires the longest stabilizing time for the voltage difference. Namely, the timing of a rise or a fall of the activation signal SE is fixed according to the mode accompanying the longest stabilizing time.

If a voltage difference between the bit lines in the flash write mode becomes stable slower than in the normal read mode, the timing of execution of the normal read will be delayed. This causes a waste of access time in the normal read mode.

If the timing of the normal read mode determined by the stabilizing time of the voltage difference is the slowest among the modes, the problem will not be conspicuous. In this case, however, an access time in the other modes that are faster than the normal read mode in stabilizing the voltage difference will cause a waste of access time.

In this way, the conventional semiconductor memory that fixes the timing of activation of a sense amplifier according to a worst operation mode having the slowest voltage difference stabilizing time causes a waste of access time in operation modes that stabilize a voltage difference faster than the worst mode. This hinders a high-speed memory operation.

SUMMARY OF THE INVENTION

An object of the present invention is to provide a semiconductor memory that surely amplifies a voltage difference between bit lines in every operation mode with no delay in access time, thereby improving an operation speed.

To accomplish the object, the present invention employs a circuit that is capable of changing the timing of activation of a sense amplifier depending on operation modes.

A first aspect (FIG. 1) of the present invention provides a semiconductor memory having a sense amplifier 1 for detecting and amplifying a voltage difference between a pair of complementary bit lines BL and BLX that transfer data to and from a memory cell; and a sense amplifier activation timing selector 2 for changing the activation timing of the sense amplifier 1 in response to an externally instructed operation mode C.

A second aspect (FIG. 3) of the present invention provides a semiconductor memory having a sense amplifier 30 for detecting and amplifying a voltage difference between a pair of complementary standard bit lines BL and BLX that transfer data to and from a standard memory cell MC; a pair of complementary dummy bit lines DBL and DBLX corresponding to the standard bit lines and having a dummy memory cell DMC corresponding to the standard memory cell; a current mirror amplifier circuit 21 for detecting and amplifying a voltage difference between the dummy bit lines; and a sense amplifier activation circuit 22 for providing a sense amplifier activation timing signal SE according to an output of the amplifier circuit.

The semiconductor memory according to the present invention changes the activation timing of the sense amplifier according to the instructed operation mode C, to thereby activate the sense amplifier at optimum timing in the operation mode. In any operation mode, a voltage difference between the bit lines is surely amplified with no delay in access time.

Even if a voltage difference between bit lines in a flash write mode becomes stable more slowly than in a normal mode, the amplification timing of the voltage difference in the normal mode will not be affected by the slowness in the flash write mode. This contributes to an improvement in operation speed of the semiconductor memory.

DESCRIPTION OF THE PREFERRED EMBODIMENTS

Semiconductor memories according to the present invention will be explained in detail with reference to the drawings.

Figure 1:
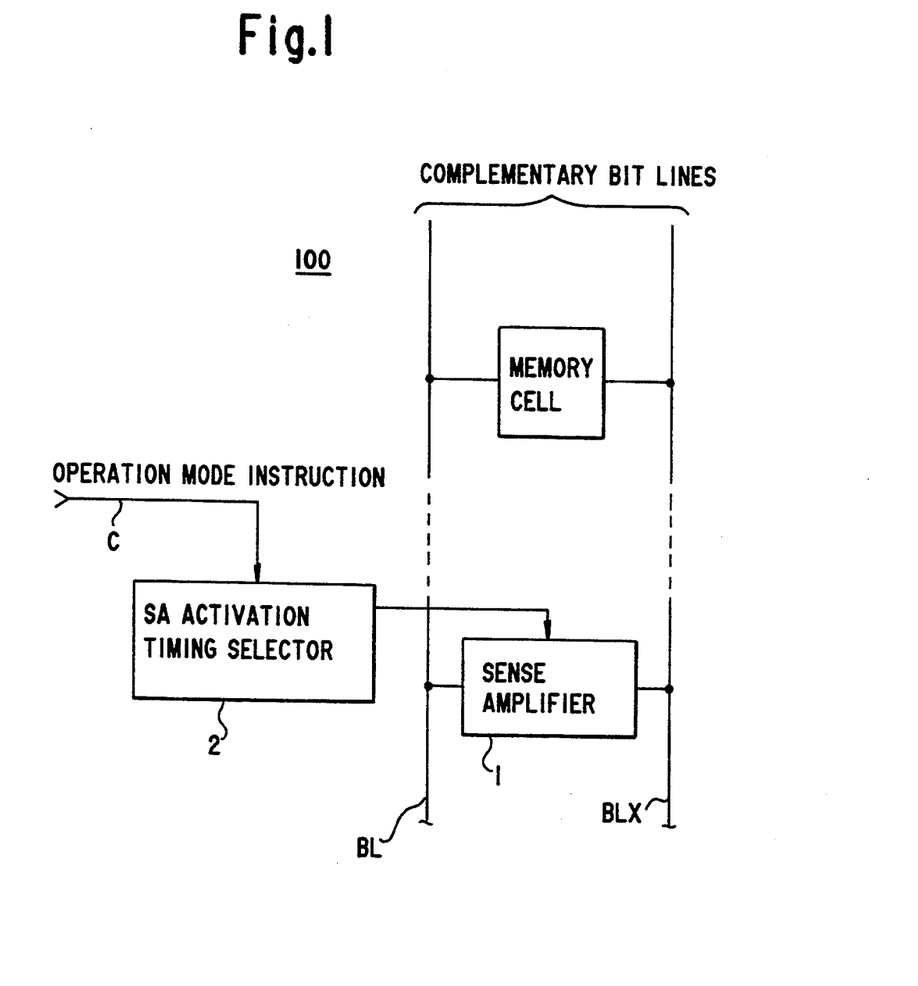
FIG. 1 is a view showing the principle of a semiconductor memory according to the first aspect of the present invention.

FIG. 1 shows the principle of a semiconductor memory 100 according to the first aspect of the present invention.

The semiconductor memory 100 has a sense amplifier 1 for detecting and amplifying a voltage difference between a pair of complementary bit lines BL and BLX that transfer data to and from a memory cell, and a sense amplifier activation timing selector 2 for changing the activation timing of the sense amplifier 1 in response to an externally instructed operation mode C.

Figure 2:
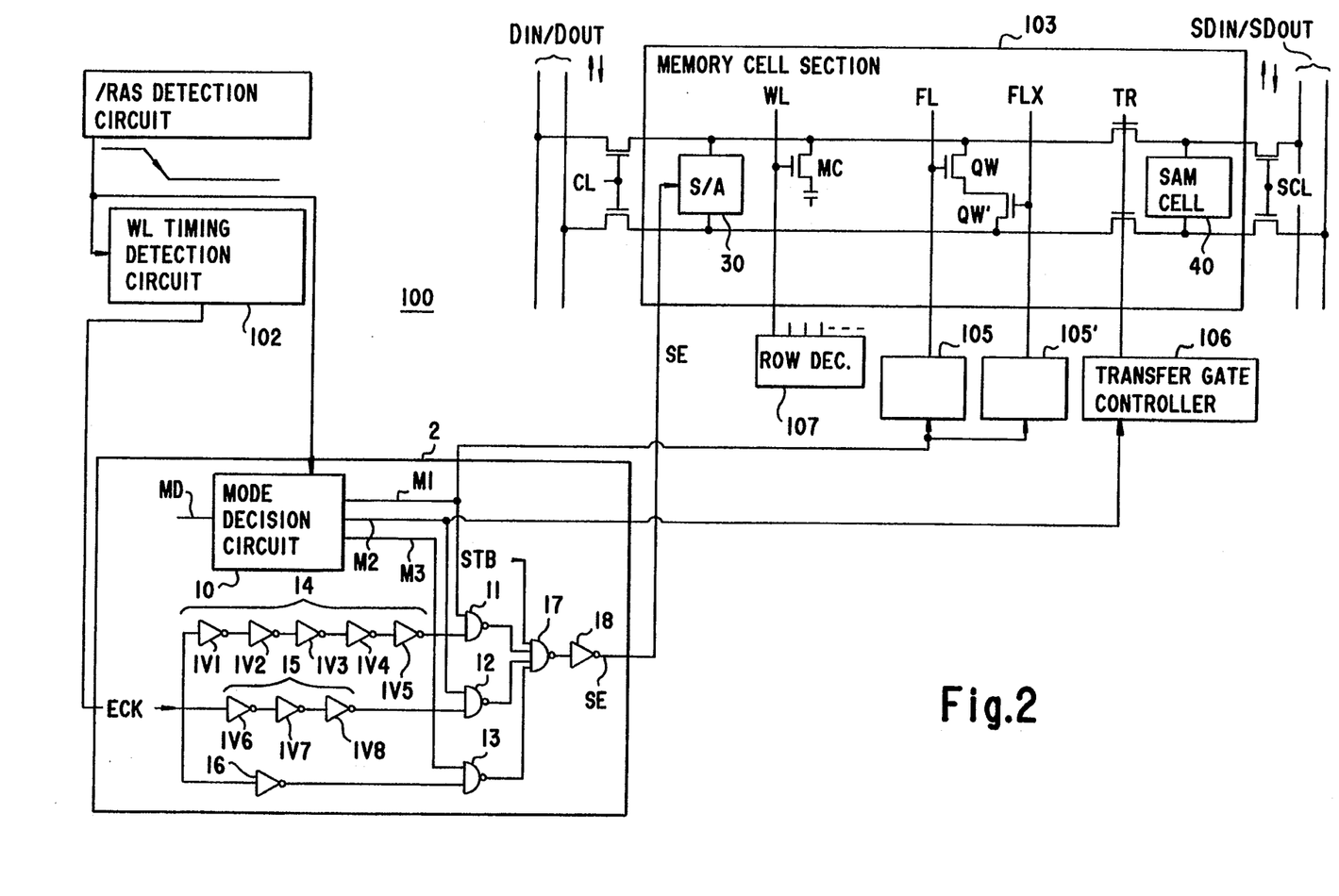
FIG. 2 is a circuit diagram showing an essential part of a dual port RAM according to the first aspect of the present invention.

FIG. 2 is a block diagram showing a semiconductor memory 100 fabricated according to the principle of FIG. 1.

The memory 100 is composed of a memory circuit 103 that is a dual port RAM capable of transferring data to and from a serial access memory, and a sense amplifier activation timing selector 2 incorporating a mode decision circuit 10.

The memory circuit 103 includes a sense amplifier 30, word lines WLs, a pair of signal lines FL and FLX for carrying out a flash write function, a signal line TR for carrying out a write transfer function, and a serial access memory (SAM) cell 40.

The memory circuit 103 may achieve, in addition to a normal read function, at least one of the write transfer function and flash write function.

When the memory circuit 103 has a total capacity of 2 megabits, it may be composed of eight blocks each including 256 kilobits with each of the blocks being provided with a pair of flash write control signal lines FL and FLX and a write transfer control signal line TR.

Each word line WL is connected to a row decoder 107. The signal lines FL and FLX are connected to flash write controllers 105 and 105', respectively. The signal line TR is connected to a transfer gate controller 106.

The mode decision circuit 10 of the timing selector 2 determines an operation mode according to input signals provided by external circuits. The input signals may include a /RAS signal, a data transfer signal /DT/OE, a write per bit/write enable signal /WB/WE, and a DRAM special function (DSF) signal. More precisely, the decision circuit 10 determines the kind of operation mode according to a logic of one or a combination of the external signals in response to a drop in the signal /RAS.

When the decision circuit 10 determines that it is a flash write mode, it provides a flash write mode specify signal M1 of level HIGH. If the decision circuit 10 determines that it is a write transfer mode, it provides a transfer write mode specify signal M2 of level HIGH. When the decision circuit 10 determines that it is a normal read mode, it provides a normal read mode specify signal M3 of level HIGH.

The semiconductor memory 100 has a word line timing detector 102. The detector 102 provides a control clock signal ECK in response to a fall of the signal /RAS, to delay circuits 14 to 16 of the timing selector 2. Outputs of the delay circuits 14 to 16 and the mode specify signals M1 to M3 provided by the decision circuit 10 are used to form a sense amplifier activation control signal SE.

It is preferable that the timing for providing the signals M1 to M3 of the decision circuit 10 is slightly earlier than the timing for providing the outputs of the delay circuits 14 to 16.

The flash write mode specify signal M1 provided by the decision circuit 10 is sent to the flash write controllers 105 and 105'. The write transfer mode specify signal M2 from the decision circuit 10 is sent to the transfer gate controller 106.

The details of the timing selector 2 will be explained with reference to FIG. 2.

The mode decision circuit 10 determines one of the flash write mode, write transfer mode, and normal read mode in response to a mode instructing external signal MD and raises one of the output signals M1 to M3 corresponding to the determined mode to level HIGH. In this embodiment, the signal M1 is set to HIGH in response to the flash write mode, the signal M2 is set to HIGH in response to the write transfer mode, and the signal M3 is set to HIGH in response to the normal read mode. The signals M1 to M3 are provided to NAND gates 11 to 13, respectively.

The control clock signal ECK from the word line timing detector 102 is also sent to a word decoder/driver (not shown). The signal ECK is supplied to each of the delay circuits 14 to 16 having different delay periods, and the delay circuits 14 to 16 provide their outputs to the NAND gates 11 to 13, respectively.

The delay circuit 14 has five inverters IV1 to IV5 connected in series. The delay circuit 15 has three inverters IV6 to IV8 connected in series. The delay circuit 16 has one inverter. The delay circuits 14 to 16 provide different delay periods for the three operation modes, respectively. These delay periods correspond to the stabilizing periods t2, t3, and t1 (FIG. 5) of the three operation modes, respectively. Namely, each of the delay periods is defined as a period within which a voltage difference produced in the corresponding operation mode between the complementary bit lines BL and BLX in response to the selecting of the word line WL becomes stable.

Outputs of the NAND gates 11 to 13 and a standby signal STB are provided to a NAND gate 17. The standby signal STB is internally produced in synchronism with an external chip enable signal and is set to level LOW when the memory is inactive.

An output of the NAND gate 17 is provided to an inverter 18, which provides the sense amplifier activation signal SE to the sense amplifier 30.

Figure 6:
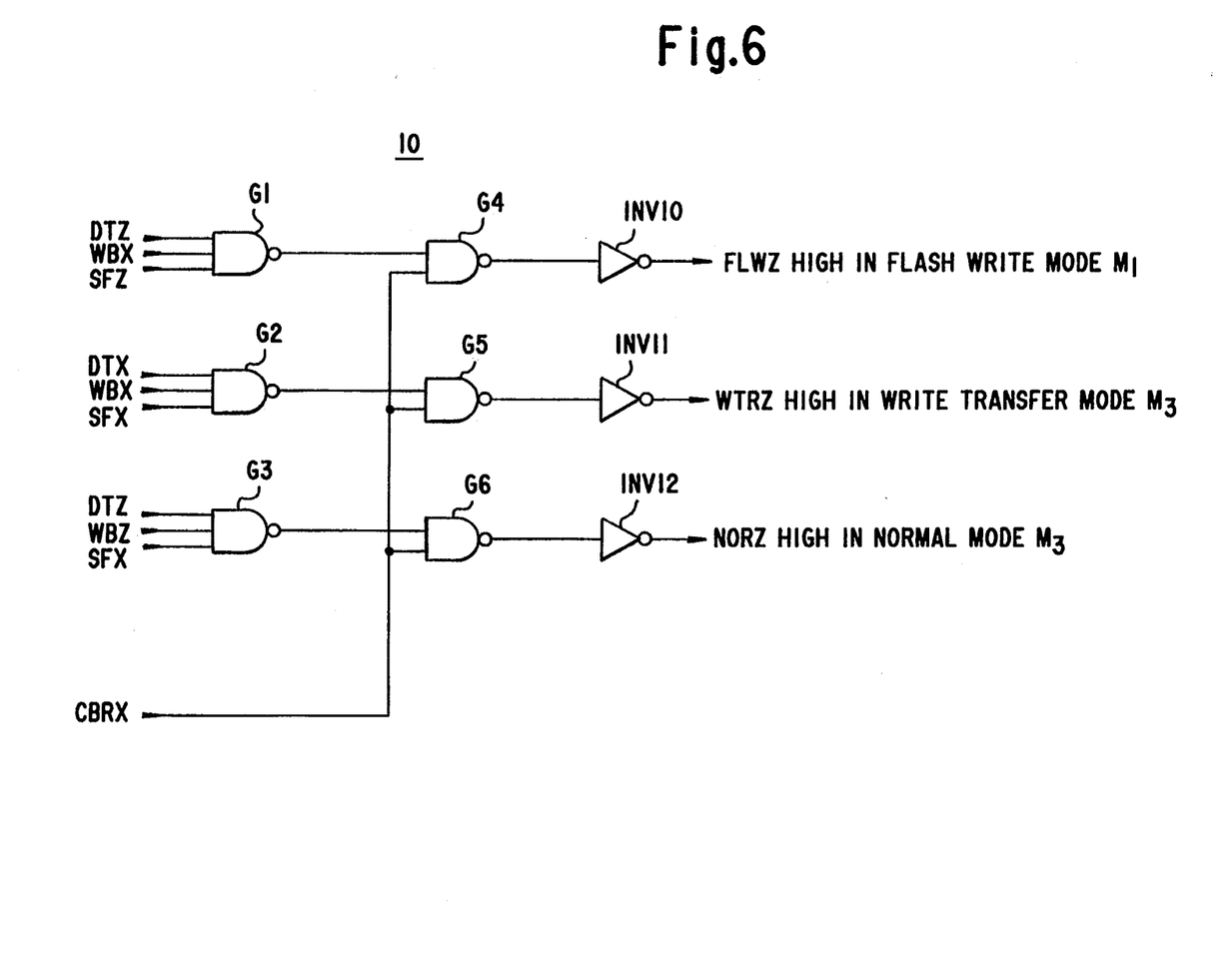
FIG. 6 is a block diagram showing an example of a mode decision circuit according to the present invention.

FIG. 6 shows an example of the mode decision circuit 10.

The circuit 10 has a 3-input NAND gates G1 to G3, 2-input NAND gates G4 to G6, and inverters INV10 to INV12. The NAND gates G4 to G6 receive outputs of the NAND gates G1 to G3, respectively, as well as a control signal CBRX. The inverters INV10 to INV12 receive outputs of the NAND gates G4 to G6, respectively, and provide the mode specify signals M1 to M3, respectively.

The circuit 10 employs, as operation mode decision signals, the external input signals, i.e., the data transfer signal /DT/OE, write per bit/write enable signal /WB/WE, and DRAM special function signal DSF. The circuit 10 receives these signals in response to a drop in the signal /RAS.

Table 1 shows logic levels of the external input signals. If the external signal /DT/OE is HIGH at the fall of the signal /RAS, an input DTZ to the circuit 10 is HIGH, and if the signal /DT/OE is LOW, an input DTX to the circuit 10 is HIGH.

If the external signal /WB/WE is HIGH at the fall of the signal /RAS, an input WBZ to the circuit 10 is HIGH, and if the signal /WB/WE is LOW, an input WBX to the circuit 10 is HIGH.

If the external signal DSF is HIGH at the fall of the signal /RAS, an input SFZ to the circuit 10 is HIGH, and if the signal DSF is LOW, an input SFX to the circuit 10 is HIGH.

The control signal CBRX provided to the 2-input NAND gates G4 to G6 is a complementary signal of an internal signal CBR such as a /CASBERORE/RAS. The signal CBR has higher priority than any other mode signals, and when this signal is provided, all other modes are canceled. The signal CBRX for controlling the NAND gates G4 to G6 becomes LOW when the signal CBR is HIGH.

In the flash write mode, an output FLWZ of the inverter INV10 provides the flash write mode specify signal M1 of level HIGH, and outputs of the other inverters INV11 and INV12 are each at level LOW.

In the write transfer mode, the output WTRZ of the inverter INV11 provides the write transfer mode specify signal M2 of level HIGH, and the outputs of the other inverters INV10 and INV12 are each at level LOW.

In the normal read mode, the output NORZ of the inverter INV12 provides the normal read mode specify signal M3 of level HIGH, and the outputs of the other inverters INV10 and INV11 are each at level LOW.

The delay circuits 14 to 16 delay the control clock signal ECK by predetermined periods optimum for the operation modes, respectively.

In this way, the sense amplifier activation timing selector 2 according to the present invention has the delay circuits 14 to 16, the mode decision circuit 10 for determining an operation mode in response to the mode instructing external signal MD, and the gates 11 to 13, 17, and 18 for selecting one of the outputs of the delay circuits 14 to 16 according to the determined mode. The timing selector 2 provides the selected one of the outputs of the delay circuits 14 to 16 as the sense amplifier activation signal SE.

The delay period achieved by one of the delay circuits 14 to 16 is set to be a period within which a voltage difference produced in a corresponding mode between complementary bit lines due to the selection of a corresponding word line becomes stable.

Operation of the semiconductor memory according to the present invention will now be explained.

The standby signal STB is set to HIGH to enable the memory. Namely, the NAND gate 17 is enabled so that an output thereof is changeable in response to input signals.

If the external instruction signal MD indicates the flash write mode, the output signal M1 will be HIGH and the other output signals M2 and M3 each LOW. Accordingly, only the NAND gate 11 is enabled, and the other NAND gates 12 and 13 are each HIGH irrespective of their inputs. As a result, the NAND gate 17 responds only to the output of the NAND gate 11.

After initialization, the control clock signal ECK is LOW, so that the output of the delay circuit 14 is HIGH. Accordingly, the NAND gate 11 provides an output of level LOW, and therefore, the NAND gate 17 provides an output of level HIGH. Then, the inverter 18 provides the sense amplifier activation signal SE of level LOW, to inactivate the sense amplifier 30.

When the control clock signal ECK is raised to HIGH, the word decoder/driver (not shown) selects a word line, which is set to HIGH. At the same time, the signal ECK is delayed through the delay circuit 14 and is inverted to level LOW, which is provided to the NAND gate 11. As a result, the output of the NAND gate 11 changes from LOW to HIGH, the output of the NAND gate 17 to LOW, and the output signal SE of the inverter 18 to HIGH.

As a result, the sense amplifier 30 is activated by the signal SE of HIGH after the predetermined delay period for the flash write mode after the rise of the level of the word line.

In this way, the embodiment changes the activation timing of the sense amplifier 30 according to an operation mode externally instructed. Namely, the sense amplifier activation signal SE is set to HIGH to activate the sense amplifier 30 at optimum timing for a corresponding operation mode. Accordingly, in any operation mode, no waste of access time will occur and a voltage difference between bit lines will be surely amplified to achieve high-speed operation.

Figure 3:
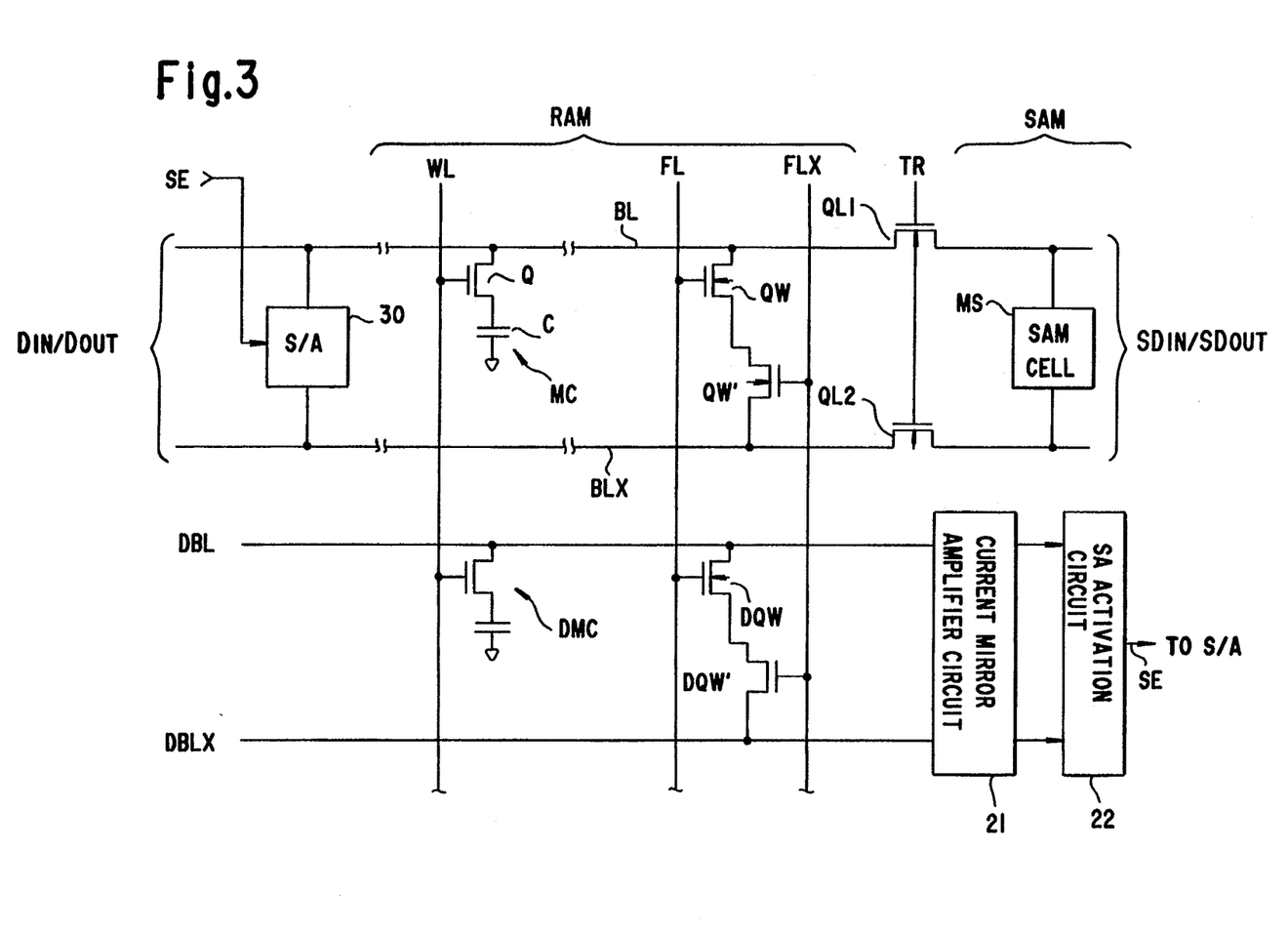
FIG. 3 is a view showing an essential part of a dual port RAM according to the second aspect of the present invention.

FIG. 3 shows a semiconductor memory 100 according to the second aspect of the present invention.

The semiconductor memory 100 has a sense amplifier 30 for detecting and amplifying a voltage difference between complementary standard bit lines BL and BLX that transfer data to and from a standard memory cell MC; a pair of complementary dummy bit lines DBL and DBLX corresponding to the standard bit lines and having a dummy memory cell DMC corresponding to the standard memory cell; a current mirror amplifier circuit 21 for detecting and amplifying a voltage difference between the dummy bit lines; and a sense amplifier activation circuit 22 for providing a sense amplifier activation timing signal SE in response to an output of the amplifier circuit.

Instead of the mode decision circuit 10 of the sense amplifier activation timing selector 2 of the first aspect to determine an operation mode according to external signals, the semiconductor memory of the second aspect employs the current mirror amplifier circuit 21 and sense amplifier activation circuit 22 to determine an operation mode and the activation timing of the sense amplifier.

This embodiment has the complementary dummy bit lines DBL and DBLX in addition to the standard complementary bit lines BL and BLX. The dummy bit lines have the memory cell DMC equivalent to the memory cell MC of the standard bit lines BL and BLX, as well as n-channel transistors DQW and DQW' used for a flash write operation.

The current mirror amplifier circuit 21 detects and amplifies a voltage difference between the dummy bit lines DBL and DBLX. The sense amplifier activation circuit 22 provides a sense amplifier activation timing signal SE of level HIGH in response to an output of the amplifier circuit 21.

When a word line WL is set to HIGH, the standard memory cell MC provides cell data to the bit line BL, to slightly increase the potential of the bit line BL. At the same time, the dummy memory cell DMC provides cell data to the dummy bit line DBL, to slightly increase the potential of the bit line DBL. Namely, a small voltage difference is produced between the dummy bit lines DBL and DBLX.

The current mirror amplifier circuit 21 detects the small voltage difference and provides an amplified output. As soon as the amplifier circuit 21 completes the amplification, the sense amplifier activation circuit 22 provides a sense amplifier activation signal SE of level HIGH to the sense amplifier 30. The sense amplifier 30 is then activated.

In this way, when a word line is selected according to a mode instructing external signal, this embodiment senses and amplifies a small voltage difference caused between the dummy bit lines, and produces a sense amplifier activation timing signal according to the amplified signal. Similar to the embodiment of FIG. 2, this embodiment is capable of activating the sense amplifier at optimum timing for the instructed operation mode.

Figure 7:
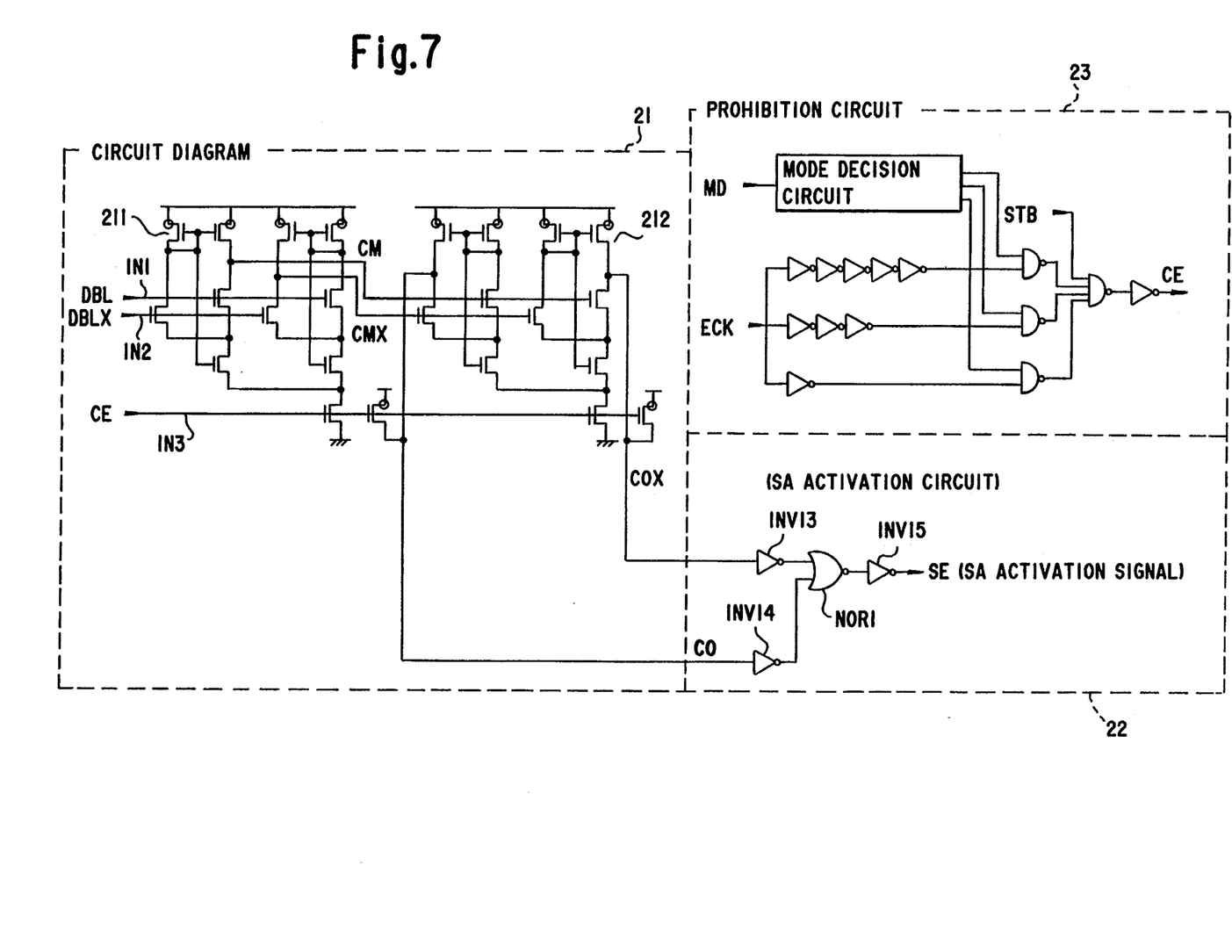
FIG. 7 is a block diagram showing a current mirror amplifier circuit and a sense amplifier activation circuit of the RAM of FIG. 3.

FIG. 7 shows examples of the current mirror amplifier circuit 21 and sense amplifier activation circuit 22.

The current mirror amplifier circuit 21 has a first amplifier 211 and a second amplifier 212 connected in series and involving n-channel MOSFETs and p-channel MOSFETs. The first amplifier 211 has input ends IN1 and IN2, which are connected to the dummy bit lines DBL and DBLX, respectively. The amplifier circuit 21 also has a third input end IN3, which receives a current mirror activation signal CE.

Output ends of the first amplifier 211 provide output signals CM and CMX to input ends of the second amplifier 212. The second amplifier 212 provides amplified signals CO and COX to inverters INV14 and INV13 of the sense amplifier activation circuit 22. Outputs of the inverters INV13 and INV14 are provided to a NOR gate NOR1. An output of the NOR gate NOR1 is provided to an inverter INV15, which provides the sense amplifier activation signal SE to the sense amplifier 30.

This embodiment has a prohibition circuit 23 for the current mirror amplifier circuit 21. The prohibition circuit 23 has substantially the same arrangement as the mode decision circuit 10 of the first embodiment. While the prohibition circuit 23 is not providing the current mirror amplifier circuit activation signal CE, operation of the current mirror amplifier circuit 21 is prohibited.

Figure 8:
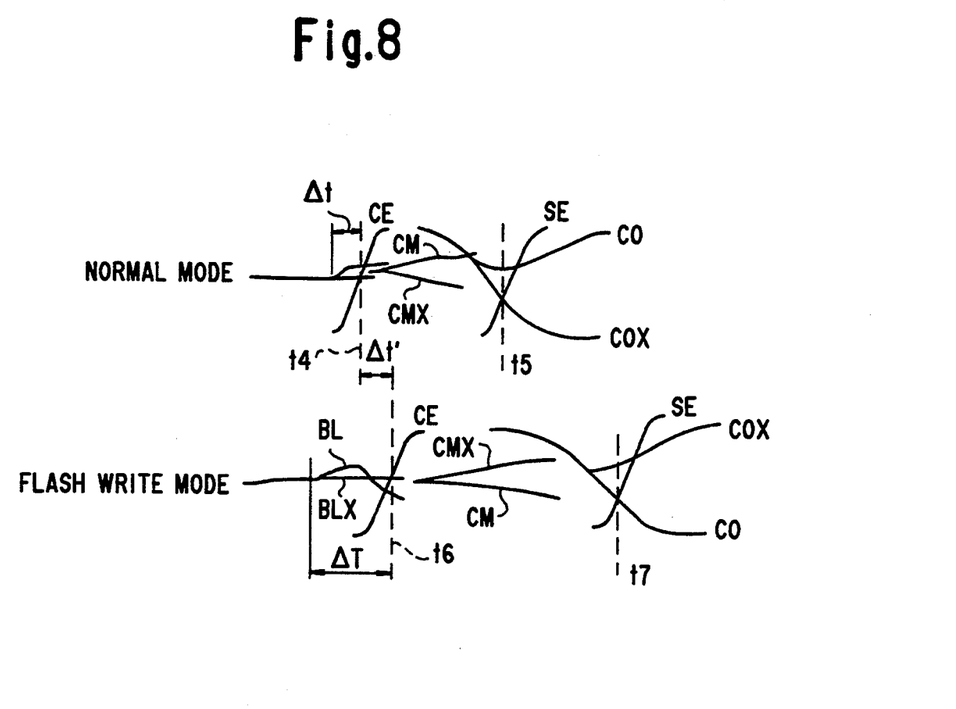
FIG. 8 is a waveform diagram showing operation of the RAM of FIG. 3.

Operation of these circuits will be explained with reference to FIG. 8.

In a normal read mode, a signal for prohibiting the current mirror amplifier circuit 21 is provided after a voltage difference appears between the bit lines BL and BLX until a predetermined period At elapses. During this period, the current mirror amplifier circuit 21 does not amplify a voltage difference between the dummy bit lines DBL and DBLX. At time t4, the current mirror amplifier circuit activation signal CE rises, and therefore, the first amplifier 211 of the amplifier circuit 21 amplifies the voltage difference and provides the output signals CM and CMX.

After a predetermined delay period, the second amplifier 212 of the amplifier circuit 21 amplifies the signals CM and CMX and provides the amplified output signals CO and COX.

At time t5, a voltage difference between the output signals CO and COX is compared with a reference voltage difference. According to the result of the comparison, the sense amplifier activation signal SE is provided.

In a flash write mode or a write transfer mode, the signal for prohibiting the current mirror amplifier circuit 21 is provided after a voltage difference appears between the bit lines BL and BLX until a predetermined period $\Delta T$ elapses. During this period, the current mirror amplifier circuit 21 does not amplify a voltage difference between the dummy bit lines DBL and DBLX. At time t6, which is behind the time t4 by a period $\Delta t'$, the current mirror amplifier circuit activation signal CE rises, and therefore, the first amplifier of the amplifier circuit 21 amplifies the voltage difference. The same processes as in the normal read mode are carried out, and at time t6, a voltage difference is compared with the reference voltage difference, to provide the activation signal SE.

Figure 9:
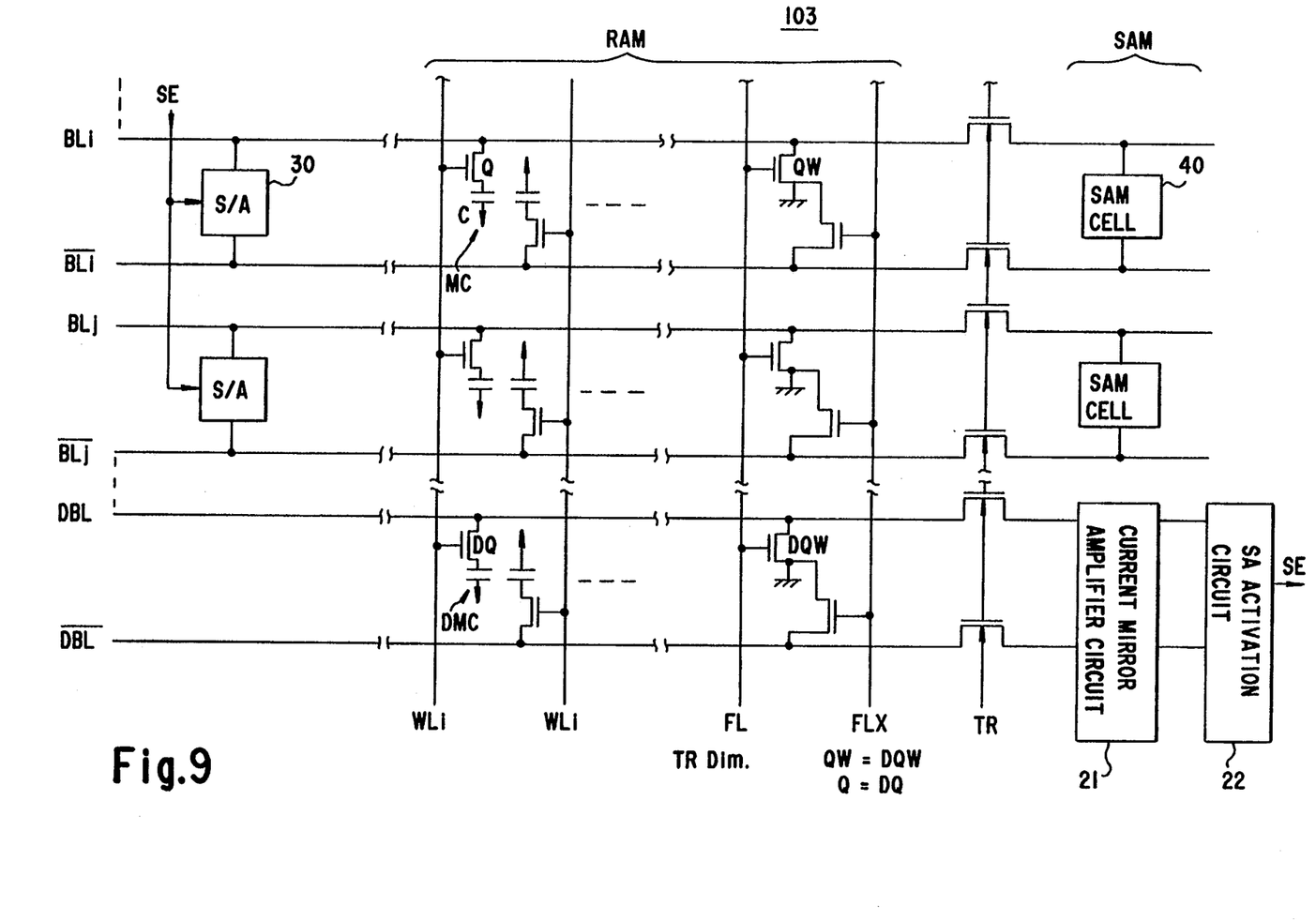
FIG. 9 is a block diagram showing an example arrangement of the RAM of FIG. 3.

FIG. 9 shows a semiconductor memory according to the second aspect of the present invention. This memory is basically the same as that of FIG. 3.

Although the above embodiments relate to the dual port RAM, the present invention is widely applicable for memories that are set in a required mode according to an external instruction.

As explained above, the present invention changes the activation timing of a sense amplifier of a semiconductor memory according to an instructed operation mode. Unlike the prior art that activates the sense amplifier at the worst possible timing to cause a waste of access time, the present invention does not involve wait time nor access time delay. The semiconductor memory according to the present invention is capable of surely amplifying a voltage difference between selected bit lines in any mode, thereby achieving a high-speed operation.

TABLE 1

Detected at a falling edge of signal /RAS
External pin level

| | | |
|---|---|---|
| DT/OE | H | DTZ = HIGH |
| | L | DTX = HIGH |
| WB/WE | H | WBZ = HIGH |
| | L | WBX = HIGH |
| DSF | H | SFZ = HIGH |
| | L | SFX = HIGH |

I claim:

1. A semiconductor memory having a sense amplifier for detecting and amplifying a voltage difference between a pair of complementary bit lines that transfer data to and from a memory cell, said semiconductor memory comprising:

a sense amplifier activation timing selection means for supplying signals to each of a plurality of said sense amplifiers at each operation mode signal so that activation timing of each sense amplifier can be changed depending upon the respective operation mode of the memory.

2. A semiconductor memory having a sense amplifier for detecting and amplifying a voltage difference between a pair of complementary bit lines that transfer data to and from a memory cell, said semiconductor memory comprising:

a sense amplifier activation timing selection means for changing an activation timing of the sense amplifier in response to an externally instructed operation mode signal, wherein the selection means includes a plurality of delay circuits for delaying an activation control signal by an optimum period for the instructed mode.

3. The semiconductor memory according to claim 2, wherein the selection means further includes:

a decision circuit for determining the kind of the instructed operation mode according to an external operation mode instruction signal; and gate circuits for selecting one of outputs of the delay circuits as a selected output according to the determined operation mode and providing the selected output as a sense amplifier activation signal (SE).

4. The semiconductor memory according to claim 2, wherein a delay period of each of the delay circuits is determined to be a period in which a voltage difference produced between the complementary bit lines in a corresponding operation mode upon the selection of a word line becomes stable.

5. A semiconductor memory having a sense amplifier (1) for detecting and amplifying a voltage difference between a pair of complementary standard bit lines that transfer data to and from a standard memory cell, comprising:

a pair of complementary dummy bit lines (DBL, DBLX) corresponding to the standard bit lines and having a dummy memory cell (DMC) corresponding to the standard memory cell;

a current mirror amplifier circuit (21) for detecting and amplifying a voltage difference between the dummy bit lines; and a sense amplifier activation circuit (22) for providing a sense amplifier activation timing signal (SE) according to an output of the current mirror amplifier circuit (21) and indicating a timing of an activation of said sense amplifier.

6. The semiconductor memory according to claim 5, wherein the sense amplifier activation circuit (22) compares the voltage difference between the dummy bit lines (DBL, DBLX) with a plurality of reference voltages, and according to a result of the comparison, provides the sense amplifier activation timing signal proper for an operation mode.

7. The semiconductor memory according to claim 1, 2, or 5, wherein the semiconductor memory is a dual port RAM that is capable of transferring data to and from a serial access memory.

8. The semiconductor memory according to claim 7, wherein the dual port RAM has at least one of the flash write function and write transfer function.

* * * * *